US 6,650,926 B1

(12) United States Patent
Chan et al.

(10) Patent No.: US 6,650,926 B1
(45) Date of Patent: Nov. 18, 2003

(54) FLEXIBLE MULTI-SECTION MRI RADIO FREQUENCY ARRAY COIL

(75) Inventors: Pei Hsuon Chan, Aurora, OH (US); Mark Xueming Zou, Aurora, OH (US)

(73) Assignee: USA Instruments, Inc., Aurora, OH (US)

( * ) Notice: Subject to any disclaimer, the term of this patent is extended or adjusted under 35 U.S.C. 154(b) by 0 days.

(21) Appl. No.: 10/108,834

(22) Filed: Mar. 28, 2002

Related U.S. Application Data

(60) Provisional application No. 60/280,283, filed on Mar. 30, 2001.

(51) Int. Cl.[7] .............................................. A61B 5/055
(52) U.S. Cl. ..................................... 600/422; 324/318
(58) Field of Search ................................ 600/410, 421, 600/422; 324/318, 322

(56) References Cited

U.S. PATENT DOCUMENTS

| 4,692,705 A | | 9/1987 | Hayes | |
|---|---|---|---|---|
| 4,825,162 A | | 4/1989 | Roemer et al. | |
| 5,280,248 A | * | 1/1994 | Zou et al. | 324/318 |
| 5,477,146 A | | 12/1995 | Jones | |
| 5,548,218 A | | 8/1996 | Lu | |
| 5,945,826 A | * | 8/1999 | Leussler | 324/309 |
| 5,951,474 A | * | 9/1999 | Matsunaga et al. | 600/422 |
| 5,986,454 A | | 11/1999 | Leifer | |
| 6,137,291 A | * | 10/2000 | Szumowski et al. | 324/318 |
| 6,300,761 B1 | * | 10/2001 | Hagen et al. | 324/318 |

* cited by examiner

*Primary Examiner*—Ruth S. Smith
(74) *Attorney, Agent, or Firm*—Pearne & Gordon LLP

(57) ABSTRACT

A MRI array coil includes a first anterior array and a second anterior array where the first and second anterior arrays each have a rigid longitudinal support, the supports being hingingly joined; and a first posterior array and a second posterior array. The first arrays are adapted to image a first volume of interest and the second arrays are adapted to image a second volume of interest, where the volumes of interest are longitudinally displaced.

6 Claims, 4 Drawing Sheets

FLEXIBLE MULTI-SECTION MRI RADIO FREQUENCY ARRAY COIL

CROSS-REFERENCE TO RELATED APPLICATION

This application claims the benefit of U.S. provisional patent application Serial No. 60/280,283 filed Mar. 30, 2001.

BACKGROUND OF THE INVENTION

The present invention relates to magnetic resonance imaging (MRI) systems and, in particular, to the radio frequency (RF) coils used in such systems.

Magnetic resonance imaging (MRI) utilizes hydrogen nuclear spins of the water molecules in a volume of interest (for example, in the human body), which are polarized by a strong, uniform, static magnetic field of the magnet (named $B_0$—the main magnetic field in MRI physics). The magnetically polarized nuclear spins generate magnetic moments in the volume of interest. The magnetic moments point in the direction of the main magnetic field in a steady state, and produce no useful information if they are not disturbed by any excitation.

The generation of nuclear magnetic resonance (NMR) signals for MRI data acquisition is accomplished by exciting the magnetic moments with a uniform RF magnetic field ($B_1$ field or the excitation field). The $B_1$ field is produced in the imaging region of interest by an RF transmit coil which is driven by a computer-controlled RF transmitter with a power amplifier. During excitation, the nuclear spin system absorbs magnetic energy, and its magnetic moments precess around the direction of the main magnetic field ($B_0$). After excitation, the precessing magnetic moments will go through a process of free induction decay (FID), releasing their absorbed energy and returning to the steady state. During FID, NMR signals are detected by the use of a receive RF coil, which is placed in the vicinity of the excited volume of interest. The NMR signal is the secondary electrical voltage (or current) in the receive RF coil that has been induced by the precessing magnetic moments of the human tissue or other volume of interest. The receive RF coil can be either the transmit coil itself, or an independent receive-only RF coil. The NMR signal is used for producing magnetic resonance images by using additional pulsed magnetic gradient fields, which are generated by gradient coils integrated inside the main magnet system. The gradient fields are used to spatially encode the signals and selectively excite a specific volume of interest. There are usually three sets of gradient coils in a standard MRI system, which generate magnetic fields in the same direction of the main magnetic field, varying linearly in the imaging volume.

In MRI, it is desirable for the excitation and reception to spatially uniform in the imaging volume for better image uniformity. In a standard MRI system, the best excitation field homogeneity is usually obtained by using a "whole-body" volume RF coil for transmission. The "whole-body" transmit coil is the largest RF coil in the system. A large coil, however, produces lower signal-to-noise ratio (SNR or S/N) if it is also used for reception, mainly because of its greater distance from the signal-generating tissues being imaged. Since a high signal-to-noise ratio is desirable in MRI, special-purpose coils are used for reception to enhance the S/N ratio from the volume of interest.

In practice, a well-designed specialty RF coil is has the following functional properties: high S/N ratio, good uniformity, high unloaded quality factor (Q) of the resonance circuit, and high ratio of the unloaded to loaded Q factors. In addition, the coil device should be mechanically designed to facilitate patient handling and comfort, and to provide a protective barrier between the patient and the RF electronics. Another way to increase the SNR is by quadrature reception. In this method, NMR signals are detected in two orthogonal directions, which are in the transverse plane or perpendicular to the main magnetic field. The two signals are detected by two independent individual coils which cover the same volume of interest. With quadrature reception, the SNR can be increased by a factor of up to the square root of 2 over that of the individual linear coils.

In MRI, a torso-pelvis RF coil is used to image the human torso region from the top of the liver to the iliac crest and the pelvic region from the iliac crest to the pubic symphysis. Abdominal and pelvic imaging a torso-pelvis coil to be able to provide good image uniformity in the axial direction (i.e., the transverse direction) as well as a good SNR. Non-uniform images caused by a inhomogeneous signal sensitivity profile of a RF coil can lead to misdiagnosis of patients. For example, a high signal in the anterior abdomen region can be mistaken for a peritoneal tumor. The coverage of a torso-pelvis coil needs to be about 30 cm for the torso imaging and about 28 cm for the pelvic imaging, respectively, for most of the patient population. A torso-pelvis coil is also required to be able to image the entire torso and pelvic regions, i.e., to cover the entire 58 cm field-of-view (FOV), without repositioning a patient. So far, the usable imaging volume, which is defined as a sphere, of a commercially available MRI apparatus is about 45 to 50 cm in diameter. Therefore, two consecutive scans are needed to cover the 58 cm FOV.

The built-in birdcage (Hayes, U.S. Pat. No. 4,692,705) transmit and receive "whole-body" coil of most MRI scanners can be used to image a patient's abdomen and pelvis with good image homogeneity and without repositioning the patient. However, the major drawback of using a "whole-body" coil as a receive coil is that the SNR is too low. The low SNR of a "whole-body" coil is caused by the low filling factor and also by the noise/unwanted signals from the tissue outside the region-of-interest (ROI). The filling factor of a RF coil is determined by the ratio of the volume of the sample (e.g., a human patient's body) being imaged to the effective imaging volume of the coil. The closer the filling factor of a RF coil to unity, the better SNR of the coil. Usually, a "whole-body" coil has an effective imaging volume much bigger than the volume of the body portion of a patient being imaged. A "whole-body" coil most the time covers a much bigger FOV (about 48 cm) than the body portion of interest in imaging (e.g., 30 cm for the torso imaging). This causes the "whole-body" coil to couple to more noise and unwanted signals from the tissue outside the ROI or volume of interest and thus to have a lower SNR.

To increase the filling factor, an elliptical birdcage coil was developed (Leifer, U.S. Pat. No. 5,986,454). In this design, the circular cross-section of a conventional birdcage coil was modified into an elliptical one so that it provides a higher filling factor for imaging the human body portion, for example: the torso, whose cross-section is more elliptical than circular. The current distribution on each of the legs of the elliptical birdcage coil was also optimized in order to obtain a homogeneous image. This elliptical birdcage coil was operated in quadrature mode.

The development of array coil technology (Roemer, et al., U.S. Pat. No. 4,825,162) allows one to image a large field-of-view while maintaining the SNR characteristic of a small and conformal coil. Using this concept, a four element "C-shaped" adjustable volume array coil was built (Jones, U.S. Pat. No. 5,477,146) to improve the SNR for volume imaging. The mechanical housing of the "C-shaped" volume array coil is divided into two parts: anterior and posterior. Electrically, the "C-shaped" volume array coil consists of four loop coils: three loop coils in the anterior housing and one loop coil in the posterior housing. Each loop coil is critically coupled to its adjacent coil or coils to minimize the inductive coupling between the two adjacent coils and hence to reduce the noise correlation caused by the cross-talk between them. The anterior housing is pivotally connected to the posterior housing by a hinge at the location close to the posterior base. This allows the anterior housing to be adjusted for positioning a patient and for fitting different size patient into the coil as well.

It has been realized that the direction of the magnetic field generated by a butterfly coil (or saddle coil) can be perpendicular to that generated by a loop coil. Thus, by using a pair of butterfly and loop coils, one can achieve quadrature detection of the magnetic resonant signal. Based on this foundation, a flexible RF coil system including three butterfly-loop quadrature pairs was constructed (Lu, U.S. Pat. No. 5,548,218). Each of the butterfly-loop quadrature pair consists of large butterfly coil and smaller loop coil sitting at the middle of the butterfly coil. The loop coils are placed right underneath the patient and the flexible wings of the butterfly coils are wrapped around the patient. Because the flexible RF coil system is wrapped around the patient, its filling factor is optimized, i.e., close to unity.

The elliptical birdcage coil (Leifer) is built on a rigid mechanical housing so that the shape and the size of the cross-section of the coil can not be changed or adjusted according to the body shape and size of a patient. In order to image large size patients, the interior of the elliptical birdcage coil must be large enough. Therefore, for most of the patient population, the filling factor of the elliptical birdcage coil is still not optimum. The elliptical birdcage coil is a single station/section coil so that it can not cover the entire 58 cm FOV, for both torso and pelvic imaging, without repositioning a patient. In other words, a technologist has to reposition the patient inside the coil between the two scans to achieve the 58 cm FOV coverage. The inherently multiple mode (i.e., multiple resonant frequencies) birdcage design makes it more difficult to extend the coverage of the elliptical birdcage coil by attaching another coil section to the elliptical birdcage coil.

The four element "C-shaped" volume array coil (Jones) can not provide uniform coverage over the entire axial direction of the torso (i.e., the cross-section of the torso) because it covers essentially only about one half (i.e., the body portion inside the "C-shaped" coil) the area of the torso cross-section. The "C-shaped" volume coil, like the elliptical birdcage coil, is also a single station/section coil so that patient reposition is needed between the two scans to achieve the full coverage for entire torso and pelvis regions (i.e., 58 cm FOV).

The flexible RF coil system (Lu) provides much higher signal at the posterior region of the torso than that at the anterior region because the main coil section (i.e., the loop coil and about one half the butterfly coil) is underneath the patient and only the wings of the large butterfly coil are wrapped around the patient to cover the anterior region. In other words, the signal homogeneity of this flexible coil system in the axial direction is not good for body imaging. Therefore, this coil system is mainly used as a vascular coil but not as a body coil.

SUMMARY OF THE INVENTION

FIG. 1 is a perspective view of an array coil according to the invention.

FIG. 2 is a perspective exploded view of an anterior support structure according to the invention.

FIG. 3 is a perspective view of an array coil according to the invention mounted about a human patient.

FIG. 4 is a perspective view of exemplary coil traces in an array coil according to the invention.

FIG. 5 is a perspective view of a single quadrature pair of coils.

FIG. 6 is an exemplary diagram of field homogeneity in a coil according to the invention.

BRIEF DESCRIPTION OF THE DRAWINGS

A MRI array coil includes a first anterior array and a second anterior array where the first and second anterior arrays each have a rigid longitudinal support, the supports being hingingly joined; and a first posterior array and a second posterior array. The first arrays are adapted to image a first volume of interest and the second arrays are adapted to image a second volume of interest, where the volumes of interest are longitudinally displaced.

DESCRIPTION OF THE PREFERRED EMBODIMENTS

Figure 1:
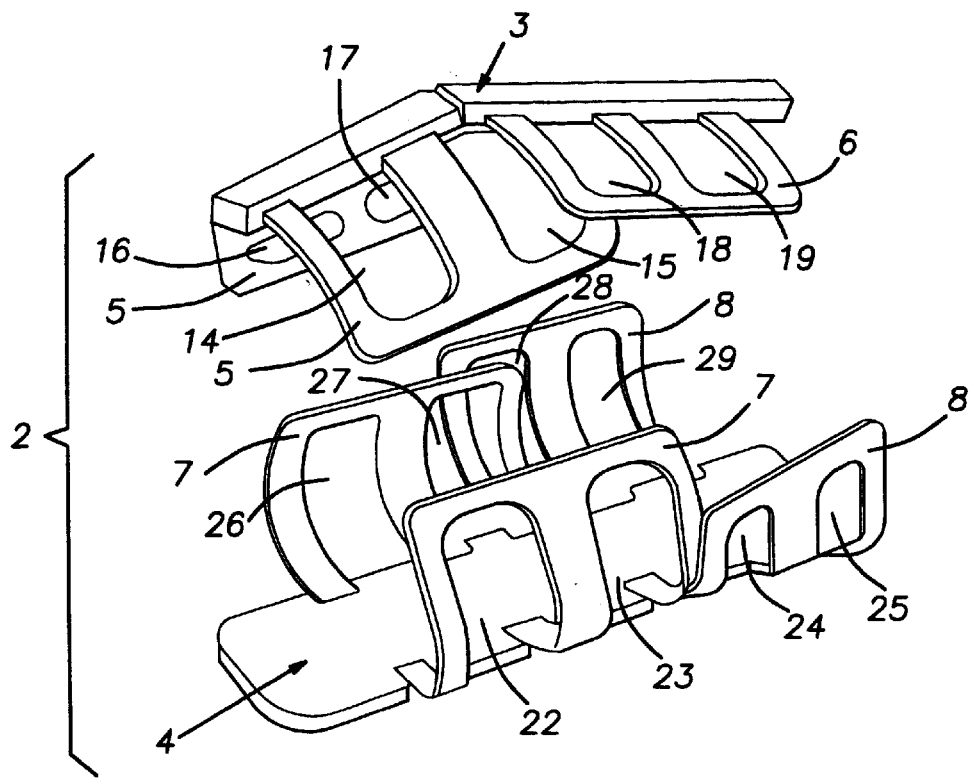
Figure 3:
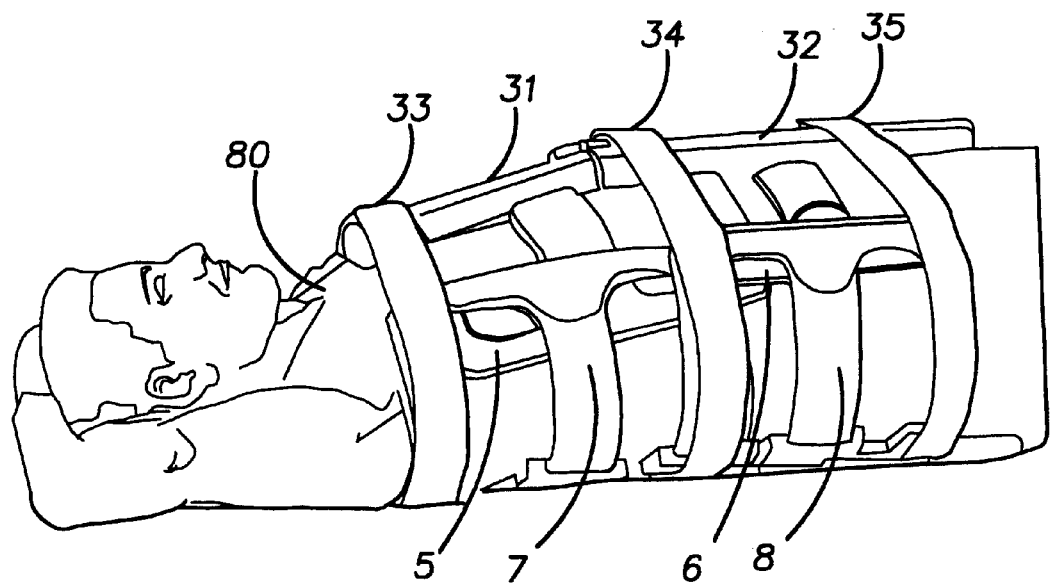

Referring to FIG. 1, a MRI coil 2 includes an anterior section 3 and a posterior section. 4. The anterior and posterior sections are further divided into a first array 5, 7 (e.g., for the torso) and a second array 6, 8 (e.g., for the pelvic area), respectively. The anterior-posterior torso arrays 5, 7 image the torso and the anterior-posterior pelvic arrays 6, 8 image the pelvic area. The torso and pelvic arrays are integrated for both the anterior and the posterior sections, as shown in FIGS. 1 and 3.

The torso coil arrays of both the anterior array 5 and the posterior array 7 may be placed inside the pelvic coil arrays 6, 8, as shown in FIG. 1. Thus, the torso coil arrays 5, 7 can be wrapped around the torso of a human patient first and then the pelvic coil arrays 6, 8 are wrapped around the pelvis of the patient outside the torso coil arrays with a bigger diameter. For patients with a pelvis size (i.e., the cross-section) larger than their torso size, i.e., the so-called "pear-shaped" patient, this torso-pelvis two separate arrays design of the present invention allows the array coil 2 to fit to the various body profiles of patients.

Figure 2:
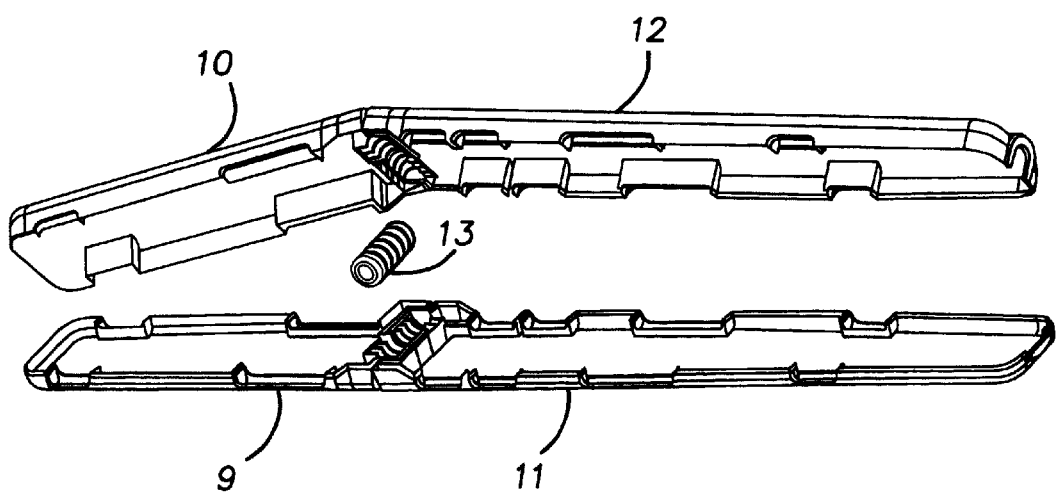

The mechanical housing of the anterior coil section, as shown in FIG. 2, may be formed, for example, from four pieces: an anterior torso bottom cover 9, an anterior torso top cover 10, an anterior pelvic bottom cover 11 and an anterior pelvic top cover 12. This housing provides a respective rigid longitudinal support for the anterior arrays 5, 7. These four anterior pieces are joined together by a pivot pin 13 inside the housing. The pivot joint allows the anterior torso housing 31 to tilt against the anterior pelvic housing 32 by up to, for example, 13 degrees, as shown in FIG. 3. This feature is also illustrated on FIGS. 1 and 2. This permits the anterior coil arrays to fit the patient body profile better by virtue of the hinging joint between the first and second anterior arrays.

There may be, for example, sixteen windows/openings (numerals 14–29) on the anterior and posterior coils, i.e., an open design. The inner surfaces of both the anterior and posterior coil housings may be covered, for example, with pads for the purpose of patient comfort. The arms/wings (5–8) of anterior and posterior coils may be molded with foam which makes the arms more flexible and also makes the array coil 2 more patient friendly. The first arrays 5, 6 image a first volume of interest such as the torso and the second arrays 7, 8 image a second volume of interest such as the pelvis. These volumes of interest are longitudinally displaced.

FIG. 3 shows a typical situation of positioning a human patient 80 inside the array coil 2 which is secured on the patient's body by three sets of Velcro belts 33, 34, 35. The posterior coil arrays 6, 8 can be wrapped around the patient's body either outside, as shown in FIG. 3, or inside the anterior coil arrays 5, 7 (which is not shown). The anterior coil arrays 5, 7 can be placed either under the Velcro belts 33, 34, 35, as the case shown in FIG. 3, or above the Velcro belts (which is not shown). For most of the patient population, the posterior coil arrays 6, 8 overlap with the anterior coil arrays 5, 7, as shown in FIG. 3. For large size patient, the posterior coil arrays 6, 8 are secured on the patient's body using the Velcro belts and then the anterior coil arrays 5, 7 are placed on the top of the Velcro belts. There can be a gap between the anterior and posterior coil arrays, in other words, these arrays may not overlap.

Figure 4:
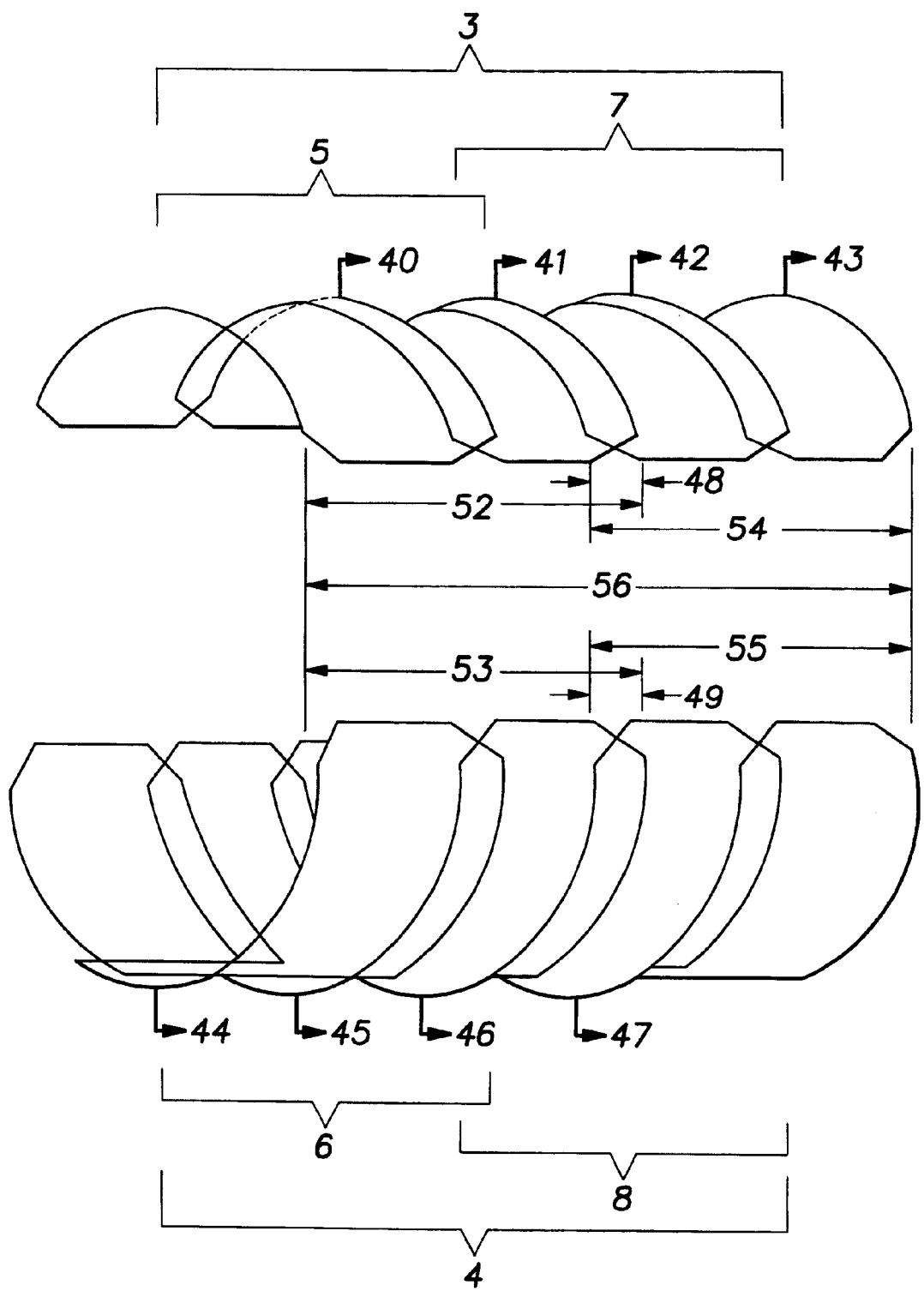

Referring to FIG. 4, a possible electrical arrangement of the array coil 2 includes eight linear coil elements: four opposing loop coils 40, 41, 42, 43 for the anterior coil section 3 and four single-mode ($B_1$ field in the transverse direction or the left-right direction) and series saddle coils 44, 45, 46, 47 for the posterior coil section 4. The loop coils 40, 41, which may be identical and are critically coupled to each other, form the first anterior array 5. The loop coils 42, 43, which may be identical and are critically coupled to each other, form the second anterior array 7. The first anterior array 5 overlaps 48 with the second anterior array 7 by, for example, about 5 cm. The arrangements for the four posterior saddle coils may be the same as those above for the four anterior loop coils. The saddle coils 44, 45, which may be identical and are critically coupled to each other, form the first posterior array 6. The saddle coils 46, 47, which may be identical and are critically coupled to each other, form the second posterior array 8. The first posterior array 6 may overlap 49 with the second posterior array 8 by about 5 cm.

The loop coils 40, 41 and the saddle coils 44, 45 form the torso coil section for imaging the torso while the loop coils 42, 43 and the saddle coils 46, 47 form the pelvic coil section for pelvic imaging. The torso and pelvic coils are integrated. The physical lengths 52, 53 of the torso arrays and the physical lengths 54, 55 of the pelvic arrays, as shown in FIG. 4 for both the anterior and posterior sections, may be, for example, 33 cm and 30 cm, respectively. The total length of the torso-pelvis coil 56 may be, for example, about 58 cm from the left-end of the superior torso coil 40 or 44 to the right-end of the inferior pelvic coil 43 or 47. The torso and pelvic coil sections are used separately, for example, the pelvic coil arrays 42, 43, 46 and 47 should be turned off while imaging the torso region with the torso coil arrays 40, 41, 44 and 45 and vice versa. Active RF blocking circuits (i.e., active decoupling chokes), which are not shown, are employed to turn off the coil elements that are not being used. When being used for imaging, the anterior loop coils and the posterior saddle coils can be fairly lined up or not lined up.

Figure 5:
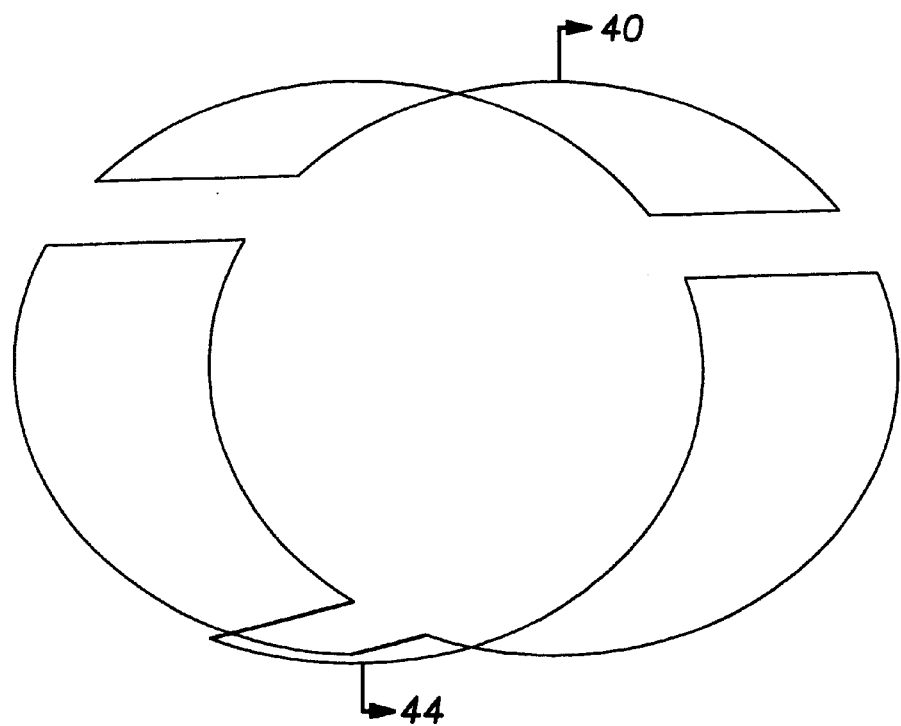
Figure 6:
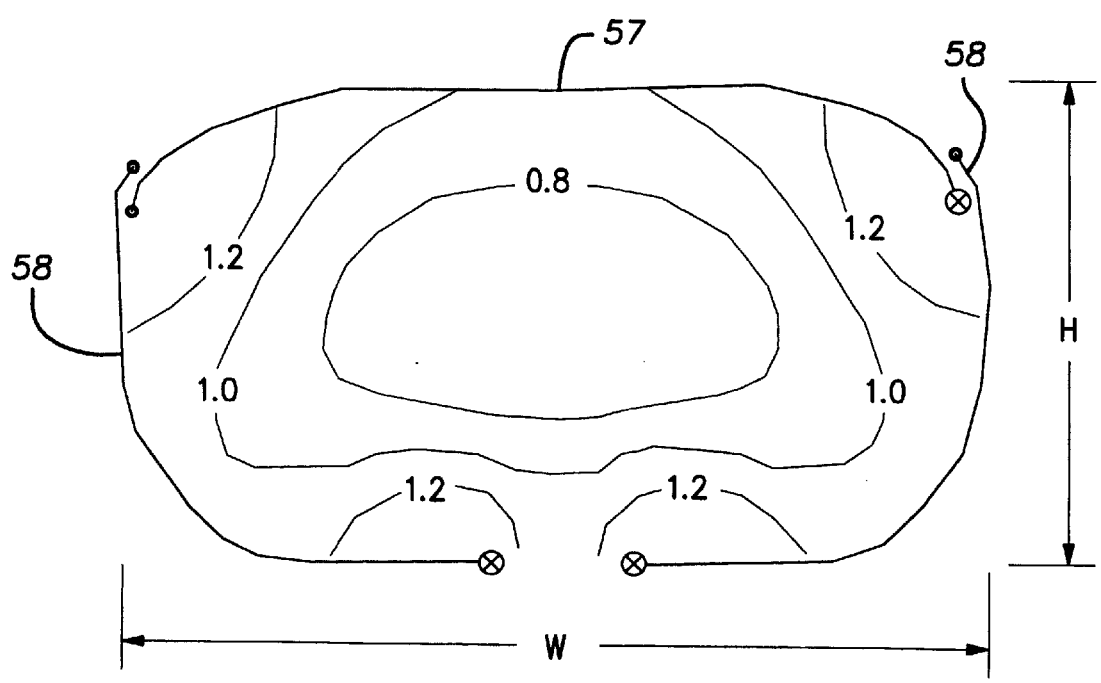

FIG. 5 provides a close look of the electric characteristics of the first loop-saddle pair of the present invention. A computed contour plot of the relative (or normalized) magnetic field strength generated by a pair of the opposing loop 57 series saddle 58 coils looking in the axial direction (i.e., a cross section in the transverse direction) is shown in FIG. 6. The size of the cross-section (W=44 cm, H=26 cm) is similar to the torso size of a human adult male (about 200 lb). The image homogeneity for the entire FOV, i.e., the total area inside the loop-saddle coil pair, is about plus or minus 20%. For smaller FOV the image homogeneity can be much better. The symbols of the "dot" and the "cross inside a circle", as shown in FIG. 6, indicate the direction of the current flowing in each of the coil element: "dot" for current flowing out of the paper and "cross inside a circle" for current flowing into the paper.

The innovative flexible four-piece and hinging anterior section design allows the array coil 2 of the present invention to well accommodate various body profiles of patients. The separate anterior-posterior, lightweight and open design make the array coil 2 more user and patient friendly. The separate anterior and posterior sections facilitate patient entrance and exit of the array coil 2 and also allow a technologist to carry each section separately. The weight of the array coil 2 is light so that it reduces the load of a technologist who is carrying it. The multiple-window design makes the array coil 2 lighter and also causes less claustrophobic feeling of the patient.

The filling factors of both the torso and pelvic coil sections are optimized, i.e., very close to unity. Each of the torso and pelvic coil sections covers essentially only the region-of-interest (ROI), e.g., 33 cm for the torso region and 30 cm for the pelvic region, to avoid coupling to the noise and the unwanted signals from the tissue outside the ROI. Therefore, the array coil 2 of the present invention provides excellent SNR for both torso and pelvis imaging as compared to a "whole-body" coil.

The anterior loop coil and posterior saddle coil pair design provides a highly uniform signal sensitivity profile over the entire cross-section of the volume being imaged, as shown in FIG. 6. There is no shading in axial images. The image homogeneity of the array coil 2 is far superior to those of the prior art (e.g., Jones and Lu).

The isolation between the anterior loop coil and the posterior saddle coil is achieved by both the quadrature isolation (i.e., the magnetic field generated by the loop coil is perpendicular to that generated by the saddle coil) and loading isolation (i.e., the body of a patient is between the anterior loop and posterior saddle coils). When the array coil 2 is wrapped around a human body, the loading isolation effect is quite significant. This reduces the need of positioning the anterior loop coil exactly symmetric over the posterior saddle coil for the purpose of quadrature isolation. Even if the coil positioning is not perfect, for example, due to a slight tilting of the anterior coil and/or non-symmetric shape of the cross-section of a patient body, the anterior coils can still be well isolated from the posterior coils and the array coil 2 can still generate uniform images with no shading. Therefore, the array coil 2 is more robust for patient positioning (i.e., more user friendly).

When using a the loop-saddle combination, the array coil 2 operates in a single mode. This single-mode array coil design makes the inductive decoupling between two adjacent coils easier and simpler than that of the multiple mode birdcage design of the prior art (e.g., Leifer). Therefore, the array coil 2 can be easily extended to cover an even bigger FOV by attaching addition coil elements to it.

The two dedicated local coils, i.e., the torso coil section and the pelvic coil section, of the array coil 2 cover the torso and pelvis regions, respectively. With two consecutive scans, one for the torso region and the other for the pelvis region, a large FOV (e.g., 58 cm FOV) image for the entire torso and pelvis regions can be reconstructed from those two small FOV images (i.e., e.g., 33 cm FOV for the torso and 30 cm FOV for the pelvis). The overlap between the torso and pelvis images, which is achieved by the exemplary 5 cm overlap between the torso and pelvic coil sections, facilitates the image recognition and registration for reconstructing the large FOV image. There is no need to reposition the patient inside the array coil 2 between the two consecutive scans.

It should be evident that this disclosure is by way of example and that various changes may be made by adding, modifying or eliminating details without departing from the fair scope of the teaching contained in this disclosure. The invention is therefore not limited to particular details of this disclosure except to the extent that the following claims are necessarily so limited.

What is claimed:

1. A MRI array coil, said coil comprising:
   a first anterior array and a second anterior array, said first and second anterior arrays each having a rigid longitudinal support, said supports being hingingly joined to each other; and
   a first posterior array and a second posterior array, said first arrays being adapted to image a first volume of interest and said second arrays being adapted to image a second volume of interest, said volumes of interest being longitudinally displaced.

2. A MRI array coil according to claim 1, wherein said first arrays are adapted to provide quadrature reception.

3. A MRI array coil according to claim 1, wherein said second arrays are adapted to provide quadrature reception.

4. A MRI array coil according to claim 1, wherein said first and second anterior arrays are formed of loop coils and said first and second posterior arrays are formed of saddle coils.

5. A MRI array coil according to claim 1, wherein at least one of said first anterior array, said second anterior array, said first posterior array and said second posterior array is adapted to flexibly wrap transversely about a respective volume of interest.

6. A MRI array coil according to claim 5, further comprising a plurality of straps to secure said MRI array coil about said volumes of interest.

* * * * *